United States Patent
Hirano

(10) Patent No.: US 7,721,425 B2
(45) Date of Patent: May 25, 2010

(54) METHOD FOR CONNECTING ELECTRONIC PARTS

(75) Inventor: Junya Hirano, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 1742 days.

(21) Appl. No.: 10/629,684

(22) Filed: Jul. 30, 2003

(65) Prior Publication Data

US 2004/0020045 A1 Feb. 5, 2004

(30) Foreign Application Priority Data

Jan. 31, 2001 (JP) .............................. 2001-024976
Sep. 7, 2001 (JP) .............................. 2001-272692

(51) Int. Cl.
*H05K 3/02* (2006.01)

(52) U.S. Cl. .......................... 29/846; 29/832; 427/305; 427/376.7; 427/376.8; 427/437; 427/438; 427/443.1

(58) Field of Classification Search ................ 29/846, 29/832, 851; 427/376.7, 376.8, 437, 438, 427/443.1, 443.2, 305, 376.6
See application file for complete search history.

(56) References Cited

U.S. PATENT DOCUMENTS 6,146,702 A * 11/2000 Zitko ....................... 427/376.6
6,403,400 B2 * 6/2002 Lin ............................ 438/121

FOREIGN PATENT DOCUMENTS

| EP | 1 009 202 A1 | 6/2000 |
| JP | 11-245083 A | 9/1999 |
| JP | 2000-38682 A | 2/2000 |
| JP | 2001-25892 A | 1/2001 |

* cited by examiner

*Primary Examiner*—Rick K Chang
(74) *Attorney, Agent, or Firm*—Birch, Stewart, Kolasch & Birch, LLP

(57) ABSTRACT

A method of connecting an electronic part, containing: forming an electroless nickel plating coat containing phosphorous on a substrate metal layer which constitutes a connecting terminal of an electronic part; and carrying out connecting to the nickel plating coat through a lead-free solder, wherein a half-width of X-ray diffraction of a (111) plane of Ni crystal in the nickel plating coat is 5 degrees or less.

4 Claims, 5 Drawing Sheets

US 7,721,425 B2

METHOD FOR CONNECTING ELECTRONIC PARTS

This nonprovisional application claims priority under 35 U.S.C. §119(a) on Patent Application No(s). 2001-24976 and 2001-272692 filed in JAPAN on Jan. 31, 2001 and Sep. 7, 2001 respectively, and under 35 U.S.C. 120 on PCT/JP02/00370 filed Jan. 30, 2002 which are herein incorporated by reference.

TECHNICAL FIELD

The present invention relates to a method for connecting electronic parts, and particularly to a lead-free solder and a plating coat to be connected to the solder.

BACKGROUND ART

Along with the recent development of small-sized and highly dense portable communication devices, personal computers, audio devices, and the like, small-sized and light weight electronic parts have been desired. The development of small-sized electronic parts has made the area of connecting terminals, such as terminal electrodes, small. Therefore, inferior connection tends to be caused, and a need has arisen to increase connection reliability.

As to connection reliability, it is desirable to improve the wettability of an electrode to a solder, and adhesive strength between a solder and an electrode. Conventionally, there has been a tendency to use electroless Ni/Au plating for the surface treatment of the electrode, to improve wettability to a solder. This electroless Ni/Au plating is accomplished by performing electroless Ni plating with phosphorous on an electrode terminal, and by further performing flash Au plating. Au on the surface layer prevents the oxidation of Ni in the under-layer during storage, and when connecting a solder the Au diffuses into the solder rapidly, thereby fresh Ni is exposed, exhibiting very high wettability to a solder.

However, the solder used here is an Sn—Pb solder, namely containing lead. It has been pointed out that machinery and tools using Sn—Pb solder after discarded are deteriorated by rain and snow, and by weathering, and give rise to soil and drinking-water pollution attributed to Pb components, with serious effects on the environment. For this, it is necessary to make haste in quickly change to electronic parts connected with a lead-free solder containing no lead.

In the case of an electroless Ni plating coat, connection is made using Sn—Pb/Ni. However, almost no studies have been done as to the connecting property between a lead-free solder and electroless Ni plating, because the electroless Ni plating coat has a short history, thus little developing in the connecting property.

Other and further features and advantages of the invention will appear more fully from the following description, taken in connection with the accompanying drawings.

DISCLOSURE OF THE INVENTION

According to the present invention, the following means are provided:

(1) A method of connecting (jointing) an electronic part, comprising:
forming an electroless nickel plating coat containing phosphorous on a substrate metal layer which constitutes a connecting terminal of an electronic part, and
carrying out connecting to the nickel plating coat through a lead-free solder,
wherein a half-width of X-ray diffraction of a (111) plane of Ni crystal in the nickel plating coat is 5 degrees or less; and (2) The method of connecting an electronic part according to the item (1), wherein the plating coat is formed using an electroless nickel plating solution containing 5.5 mass % or less of phosphorous.

BEST MODE FOR CARRYING OUT THE INVENTION

The inventors of the present invention have made studies concerning the connection of electroless Ni plating forming a connecting terminal of an electronic part. As a result, we have found that the following problems arise when connecting a lead-free solder to the electroless Ni plating coat. These problems have been found to arise significantly in the case of pads 300 μm or less in size on wafer surface, CSP (chip size package), and the like.

1. The adhesive strength is decreased more conspicuously in the case of a lead-free solder than in the case of an Sn—Pb solder.

2. Electroless Ni plating is eluted into a solder after repeating reflow.

3. Surface oxidation is easily caused when plating a gold thin film.

This brings about the results that the reliability of the connected section is conspicuously impaired. Thus, the inventors have made earnest studies to eliminate these drawbacks.

As a result, the present inventors have found the following fact. Specifically, diffusion between a solder and Ni metal takes place at the boundary between an Ni plating layer and the lead-free solder, to produce a diffusion layer of "electroless Ni plating/solder". The inventors have paid attention to the relations between this diffused layer and adhesion and between the diffused layer and crystallinity of the Ni plating layer. As a result, the inventors have found that the connection boundary between the solder/the electroless Ni plating can be improved by controlling the crystallinity of the electroless Ni plating, and also confirmed that this has a significant effect on the adhesion, to complete the present invention.

The present invention will be explained in more detail below.

Figure 1:
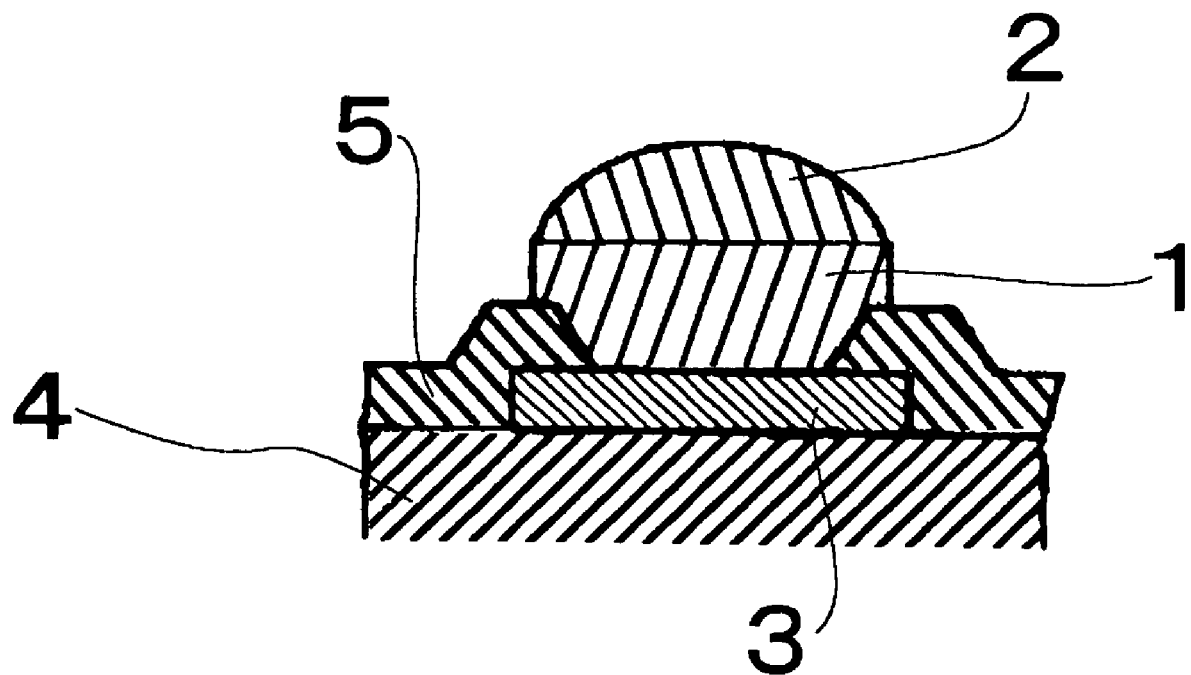
FIG. 1 is a sectional view of the electrode structure of a semiconductor in one embodiment according to the present invention.

A method of connecting to a nickel coat of a semiconductor chip through a solder, in one embodiment of the present invention, will be explained, with reference to FIG. 1. An electrode substrate 3 made of Al, Cu or the like is formed on a semiconductor substrate 4 of a semiconductor element. The reference letter 5 represents an insulating film made of a resin. Because an oxidized film is naturally generated on the electrode metal layer 3, an acid or an alkali is used as an etching solution to remove the naturally oxidized film formed on the surface after degreasing treatment is performed. Commercially available zincate-treating solution is used just after the etching solution is washed away, to substitute the surface layer formed on the electrode substrate 3 with Zn, thereby preventing the surface layer from being reoxidized. Thereafter, the semiconductor element is washed with pure water, and then it is soaked in a phosphorous-containing electroless Ni plating solution which is generally used and heated to about 50° C. to 90° C., to form an Ni plating coat 1 only on the electrode substrate 3. After the Ni plating film is formed in a predetermined thickness of about 0.5 to 20 µm, the plating solution is washed with water, to form a flash Au plating layer only on the Ni plating coat 1.

Next, the semiconductor element is soaked in a vessel filled with a melt solder, to selectively form a solder layer 2 for the formation of a bump on the place where the flash Au layer plating film is present. The solder used at this time is preferably a solder, such as Sn—Ag, Sn, and Sn—Ag—Cu, and these solders are lead-free solders in consideration of the problems after they are dumped. The temperature in the solder vessel is preferably about 180 to 250° C.

Although the case of connecting a semiconductor chip is described as one embodiment, a lead-free solder layer may be also formed in the same manner as mentioned in the above, on a phosphorous-containing nickel plating coat, in the case of a ball grid array in a package of electronic parts.

The present invention is to form an electroless Ni plating coat having high crystallinity of Ni in the phosphorous-containing electroless Ni plating coat to be formed at this time.

When a solder ball is placed on the Ni plating coat, diffusion takes place between the solder and the Ni metal at the phase boundary between the Ni plating coat and the solder, to produce an electroless Ni plating/solder diffusion layer. It has been found that at this time, the adhesive strength of an Ni plating coat having high crystallinity improves by the generation of the highly-uniform diffused layer, thereby preventing the dissolution of Ni plating.

The crystal structure of Ni of a metal plating layer formed in a usual electroless Ni plating process differs depending on the type of plating solution to be used, a heat load in a plating step, or the like. The x-ray diffraction half-width of the (111) plane of Ni crystal was generally 6 to 12 degrees.

Figure 2:
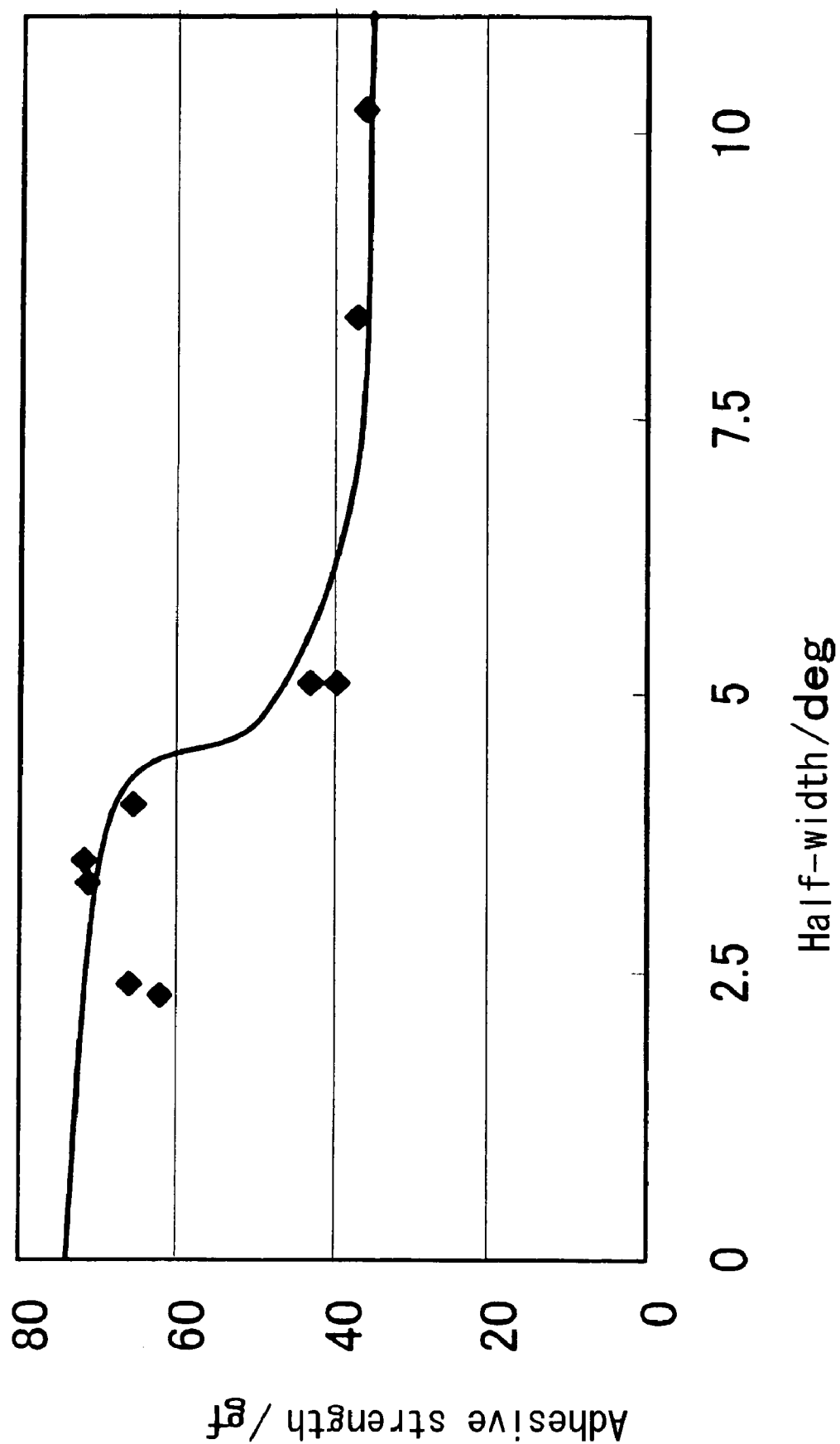
FIG. 2 is a graph showing the relationship between the half-width of X-ray diffraction and the shear strength of an Sn—Ag solder ball.

Therefore, electroless Ni plating coats changed variously in crystallinity were formed on a pad which was 80 µm by 80 µm square, and a lead-free Sn—Ag solder ball having a diameter of 150 µm was placed thereon, to measure shear strength. The crystallinity of the electroless Ni plating coat is expressed by the X-ray diffraction half-width of the (111) plane in an X-ray diffraction analysis. The shear strength (adhesive strength) shows the force required to peel off a solder from a plating coat. The obtained results are shown in FIG. 2.

It is understood from these results that the shear strength is increased suddenly when the X-ray diffraction half-width of the (111) plane of Ni crystal is below 5 degrees and the crystallinity is increased. As to the solubility of an Ni plating coat in a solder, Ni is dissolved when the half-width is greater than 5 degrees whereas the dissolution of Ni can be prevented when the half-width becomes smaller than 5 degrees.

When the X-ray diffraction half-width becomes 5 degrees or less, a destructive boundary arises in the inside of the solder and no destruction arises at the boundary between the plating and the solder. No dissolution of the Ni plating is observed from the microphotograph of the boundary, and the diffused layer is formed uniformly.

Although the adhesive strength can be secured and the elution of the Ni plating coat can be prevented if the X-ray diffraction half-width of the (111) plane of Ni crystal is 5 degrees or less, the adhesive strength is further increased when the X-ray diffraction half-width is 4 degrees or less, which is hence preferable. However, making the half-width 2 degrees or less is accompanied by technical difficulties, for example, in the preparation of the electroless Ni plating solution and in an annealing step and is therefore economically unadvisable. Therefore the X-ray diffraction half-width of the (111) plane of Ni crystal is more preferably in a range from 4 degrees to 2 degrees.

The inventors have found that there is a method using annealing in a plating step, as means for increasing the crystallinity of electroless Ni plating containing phosphorous.

Figure 3:
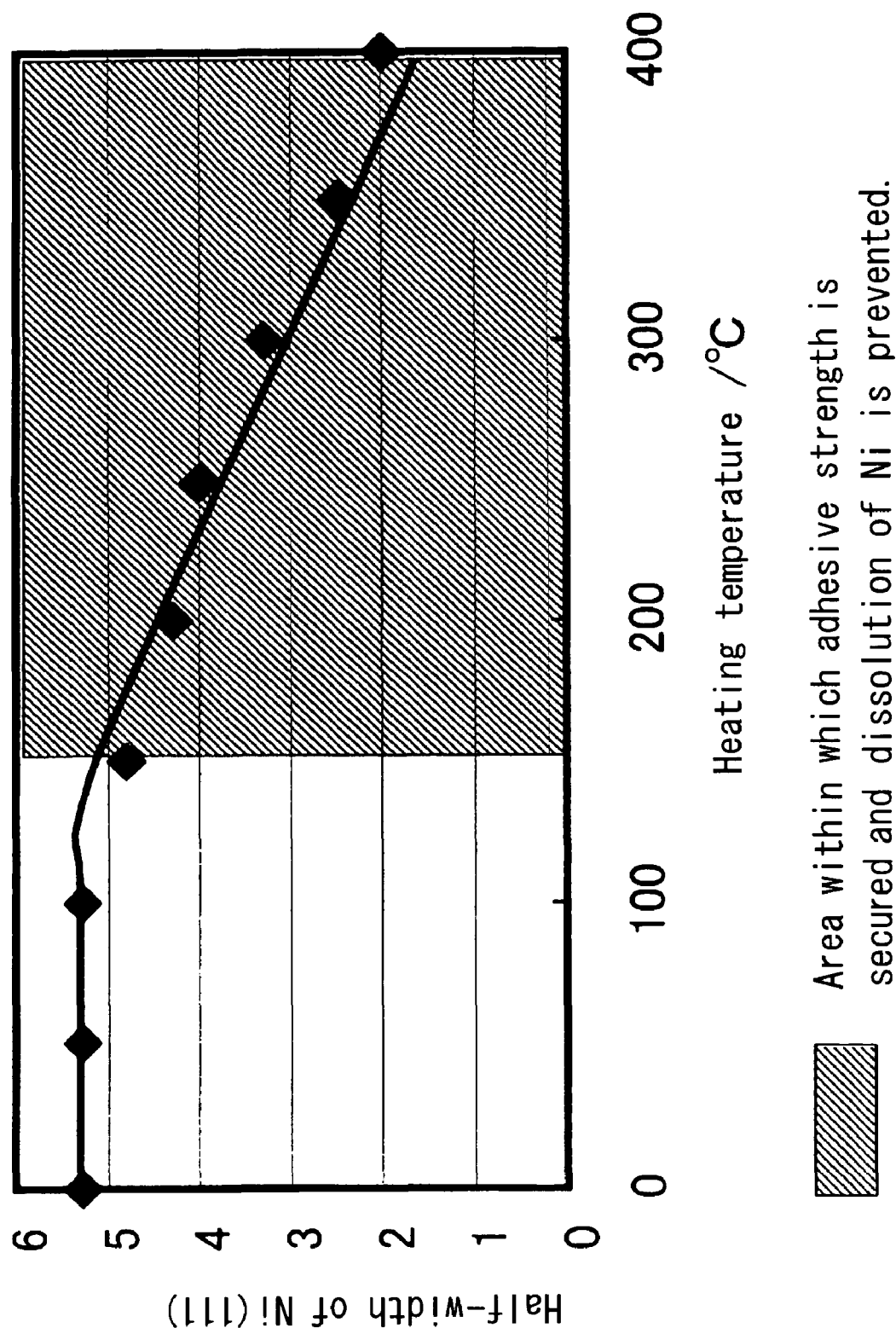
FIG. 3 is a graph showing a change in the crystallinity of electroless Ni plating by heating.

The inventors have made studies concerning the relationship between the annealing temperature in the electroless Ni plating step and the crystallinity of the produced electroless Ni plating layer, to obtain the result as shown in the graph of FIG. 3 by experiments. As is understood from this graph, it has been recognized that the X-ray diffraction half-width of the (111) plane of Ni crystal is made to be 5 degrees or less and the crystallinity increases by annealing treatment carried out at a temperature of 150° C. or more. Also it has been found that if the nickel plating coat is coated with a lead-free solder, the adhesion of the coating improves and the dissolution of Ni can be prevented.

The annealing temperature is preferably 150° C. or more. However, an Ni plating coat having a half-width of 4 degrees to 2 degrees is preferable in consideration of the adhesion to the solder, as mentioned above. Therefore the annealing temperature is more preferably 250° C. to 400° C.

Also, the inventors have found a method in which the content of P in an electroless Ni plating solution to be used is controlled, as means for increasing the crystallinity of the electroless Ni plating.

Figure 4:
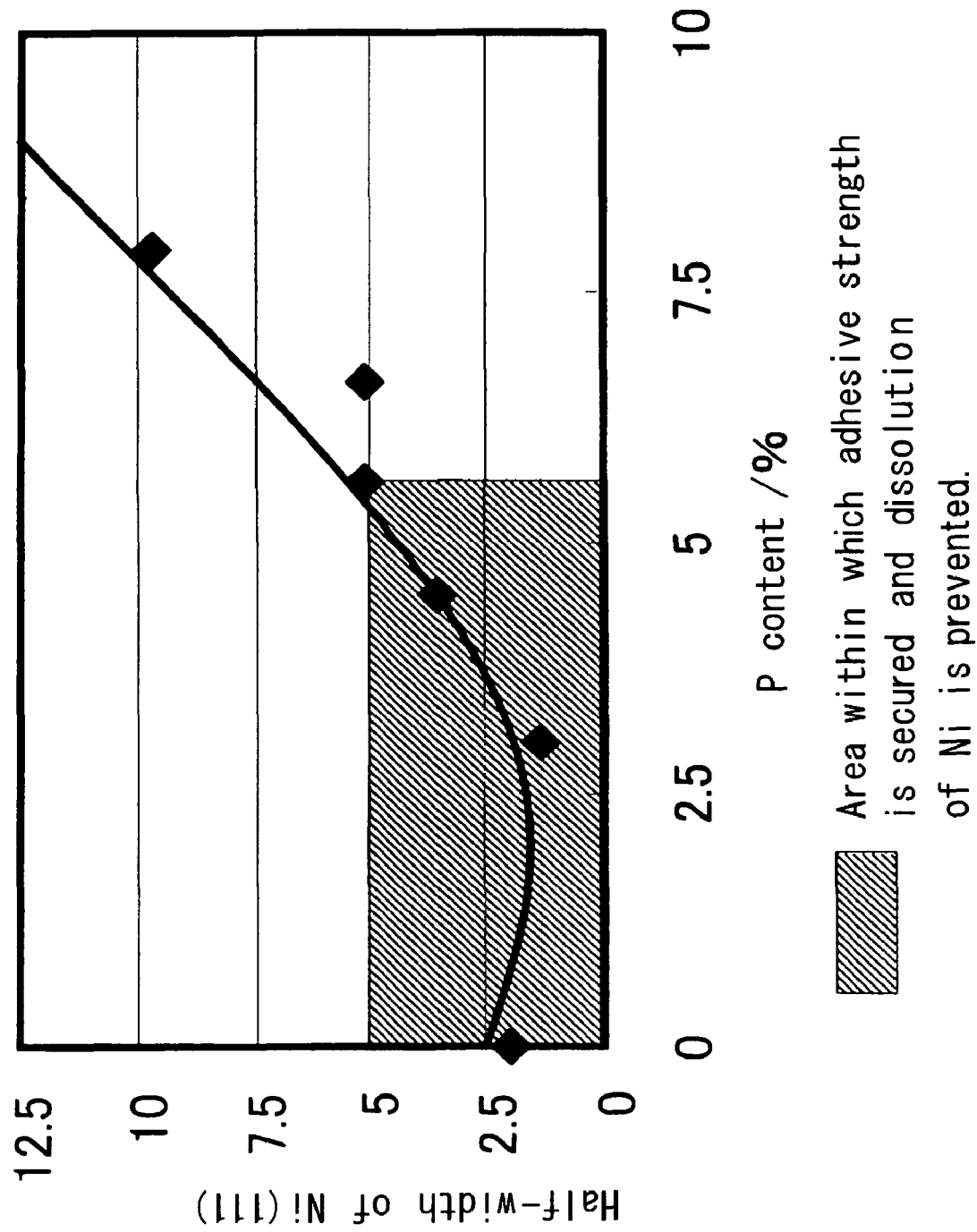
FIG. 4 is a graph showing the relationship between the P content of a nickel plating solution and crystallinity.

The inventors have made studies concerning the relationship between the content of P in the phosphorous-containing electroless Ni plating solution to be used and the crystallinity of the produced electroless Ni plating coat. As a result, we have obtained the results as shown by the graph of FIG. 4, by experiments, in the same manner as mentioned in the above. As is understood from this graph, it has been recognized that when the content of P in the electroless Ni plating solution drops below 5.5 mass %, the X-ray diffraction half-width of the (111) plane of Ni crystal of the electroless Ni plating coat is decreased to 5 degrees or less, thereby the crystallinity increases. If so, it is understood that when a solder is placed on the plating layer, the adhesion therebetween is improved and Ni can be thereby prevented from dissoluting.

Accordingly, the content of P in the electroless Ni plating solution is preferably 5.5 mass % or less. As mentioned above also, the content of P is more preferably 4.5 mass % or less, in view of preferable adhesion to the lead-free solder.

From this pint of view, it is clear that if the X-ray diffraction half-width of the (111) plane of Ni crystal of the electroless Ni coating is made 5 degrees or less by controlling the annealing temperature in the plating step or the content of P in the plating solution, the adhesion to a lead-free solder can be secured and the dissolution of Ni is therefore prevented.

Figure 5A:
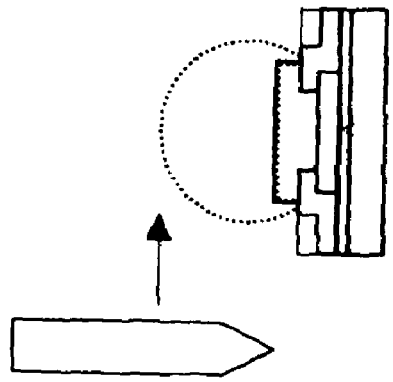
FIG. 5(a) is a typical explanatory view showing a method of measuring shear strength.
Figure 5B:
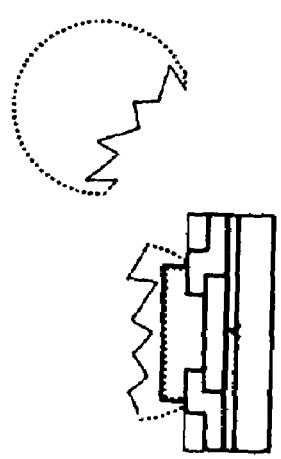
FIG. 5(b) is a typical explanatory view of a sample in which a destructive boundary at the time of destruction arises in the inside of a solder.
Figure 5C:
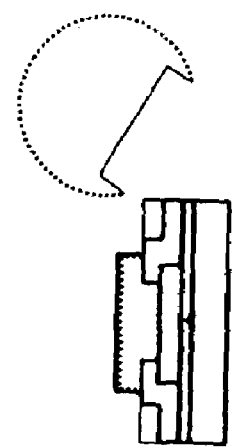
FIG. 5(c) is a typical explanatory view of a sample in which a destructive boundary at the time of destruction arises at a boundary between the Ni plating surface and the solder surface.

In the present invention, the shear strength is the force required to peel off the lead-free solder placed on the plating coat from the plating coat. A method of measuring the force is shown in FIG. 5 by way of a typical view. FIG. 5(a) is a typical view of the state in the case where a destructive boundary at the time of destruction arises inside of the solder. In the case of such a destructive state, the adhesion at the boundary was judged to be good. Further, FIG. 5(c) is a typical view of the state in the case where a destructive boundary at the time of destruction arises at a boundary between the Ni plating surface and the surface of a solder. In the case of such a destructive state, the adhesion at the boundary was judged to be poor.

The method for connecting electronic parts according to the present invention is characterized in that the X-ray diffraction half-width of the (111) plane of Ni crystal of the nickel plating coat is 5 degrees or less. This method, therefore, ensures good adhesion between the Ni plating surface and the surface of the lead-free solder, and it ensures very strong shear strength, and in this method, even if destruction arises, the destruction takes place in the inside of the solder. Further, the electroless Ni plating is not eluted even by repeating reflow. In particular, even if a pad as small as 300 μm or less is used, this effect can be sufficiently exhibited. Therefore, the reliability of the connecting portion is greatly improved.

Also, since the electronic part according to the present invention is one obtained by coating a nickel plating coat with a lead-free solder, it is free from a need to worry about environmental pollution even if electronic machinery and tools mounted with this electronic part is discarded as a waste.

EXAMPLES

The present invention will be described in more detail based on examples given below, but the present invention is not limited by these examples.

Example 1

Production of UBM (Underlaid Bump Metal Layer) using Phosphorous-Containing Electroless Nickel Plating A wafer having the following Al pad which is an electrode substrate was prepared.
Al pad on the wafer
Material: Al containing 1 mass % of Si
Size: 100×100 μm
Thickness of Al: 1.0 μm
Electroless Ni plating-Au plating was carried out on the pad of this electrode substrate in the following steps.

First, the pad is subjected to degreasing treatment performed at 21° C. for one minute by using a degreaser having surface active ability, and the oxide film produced on the surface of the Al electrode was removed using an aqueous 3% hydrogen fluoride solution. Next, just after the resulted surface was washed away with a nitric acid solution, the electrode surface was treated using a commercially available alkali zincate solution (SABSTAR ZN 111 (trade name), manufactured by Okuno Seiyaku) at 21° C. for 2 minutes to substitute with Zn, thereby preventing the surface from being oxidized. In succession, after the zincate solution was washed away with pure water, the wafer was soaked in a commercially available medium-phosphorous-type electroless Ni plating solution (Electroless Ni Plating Nikoron Z (trade name), manufactured by Okuno Seiyaku) kept at 85° C. for 30 minutes, to form an Ni plating coat on the Al pad. The thickness of the resulting film was 8.0 μm. After the wafer was washed with pure water, an electroless Au plating solution (TKK-51 (trade name), manufactured by C. Uyemura & Co., Ltd.) was used, to form a flash Au plating layer, at 85° C. for 8 minutes. After washed, the wafer was subjected to annealing carried out at 300° C. for one hour.

The electroless Ni plating and annealing, performed in the above steps, brought about the result that the electroless Ni plating coat had a crystal structure in which the X-ray diffraction half-width of the (111) plane was changed from 5.5 degrees to 3.2 degrees.

The results of an investigation, made on adhesion and diffusion to an Sn—Ag solder as to whether annealing was performed or not, are shown below.

TABLE 1

Comparison of conditions of shear strength and diffusion as to whether annealing was performed or not

| | Shear test result | | |
|---|---|---|---|
| | Shear strength/gf | Destructive boundary | Condition of diffusion |
| Annealing was not performed | 40 gf | Destroyed at the Ni/solder boundary | Ni plating was dissolved into the solder and the diffused layer was scattered into the inside of the solder |
| Annealing was performed | 70 gf | Destroyed inside of the solder | Ni plating was not dissolved into the solder and the diffused layer was formed uniformly |

In the above manner, the crystal structure of the Ni plating coat was changed by the annealing, which improved the adhesion to an Sn—Ag solder and also the condition of diffusion.

Example 2

Use of a P-Containing Electroless Ni Plating Solution Having a P Content of 4%

Electroless Ni—Au plating was carried out on the following pad which was an electrode substrate.
Pad
Pad surface: electrolytic copper
Pad size: ø300 μm (shape of the pad: circular type)
Periphery of the pad: solder resist (epoxy)
Nickel plating was performed on the pad in the following manner.

First, the pad was subjected to degreasing treatment performed using a degreasing solution having surface active ability at 60° C. for 5 minutes, and it was treated for one minute by using an etching solution composed of hydrogen peroxide/sulfuric acid, to remove the oxide film produced on the surface thereof. In succession, the pad was washed with 3% sulfuric acid for 30 seconds, and it was subjected to a catalyst solution treatment using a commercially available Pd catalytic solution having a Pd concentration of 3 mg/l for 2 minutes at 30° C., to impart the catalyst nucleus of Pd to the surface. Next, the pad was soaked in a solution having phosphorous content of 4%, which was obtained by adjusting a commercially available electroless Ni plating solution (Electroless Ni Plating Nikoron Z (trade name), manufactured by Okuno Seiyaku) to pH 5.5, at 85° C. for 30 minutes, to form an Ni plating coat on the pad. The thickness of the resulting film was 8.0 μm. After the pad was washed with pure water, an electroless Au plating solution (TKK-51, manufactured by C. Uyemura & Co., Ltd.) was used, to form a Au plating layer, at 85° C. for 8 minutes.

When this electroless Ni plating solution having a P content of 4% was used, the X-ray diffraction half-width of the (111) plane of Ni crystal of the resulting plating coat was 4.5 degrees.

An Sn—Ag solder ball was placed on the pad of the electroless Ni plating produced by this process, to carry out a shear test. As a result, it was found that all destructive phenomena occurred in the inside of the solder.

INDUSTRIAL APPLICABILITY

According to the method for connecting electronic parts according to the present invention, good adhesion between the Ni plating surface and the surface of a lead-free solder is obtained, very strong shear strength is obtained, and, even if destruction is produced, the destruction arises inside of the solder. Also, even if reflow is repeated, electroless Ni plating is not eluted. In particular, even if a pad has a size as small as 300 μm or less, this effect is sufficiently exhibited. Therefore, this method is preferably as a method to largely increase the reliability of the connecting portion.

Further, since the electronic part according to the present invention is produced by coating a nickel plating coat with a lead-free solder, the method of the present invention is preferable as a method free from a need to worry about environmental pollution even if electronic machinery and tools mounted with this electronic part is discarded as a waste.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A method of connecting an electronic part, comprising:
   forming an electroless nickel plating coat containing phosphorous on a pad having a size of 300 μm or less in diameter and comprising Ni crystals that have a half-width of X-ray diffraction of a (111) plane in a range of 4 degrees to 2 degrees, on a substrate metal layer which constitutes a connecting terminal of an electronic part; and
   carrying out binding to the nickel plating coat through a lead-free solder.

2. The connecting method according to claim 1, wherein the plating coat is formed using an electroless nickel plating solution containing 5.5 mass % or less of phosphorous.

3. The connecting method according to claim 1, wherein the plating coat is formed using an electroless nickel plating solution containing 4.5 mass % or less of phosphorous.

4. The connecting method according to claim 1, wherein annealing is carried out at a temperature of 250° C. to 400° C., after the electroless nickel plating coat is formed.

* * * * *

UNITED STATES PATENT AND TRADEMARK OFFICE
CERTIFICATE OF CORRECTION

Page 1 of 1

PATENT NO. : 7,721,425 B2
APPLICATION NO. : 10/629684
DATED : May 25, 2010
INVENTOR(S) : Junya Hirano It is certified that error appears in the above-identified patent and that said Letters Patent is hereby corrected as shown below:

On the Title page, the following is inserted as item (63):

-- Related U.S. Application Data

(63) Continuation of application No. PCT/JP02/00730, filed on Jan. 30, 2002. --

Signed and Sealed this
Eighteenth Day of January, 2011

David J. Kappos
*Director of the United States Patent and Trademark Office*